United States Patent [19]

Kessler, Jr. et al.

[11] 3,769,688

[45] Nov. 6, 1973

[54] METHOD OF MAKING AN ELECTRICALLY-INSULATING SEAL BETWEEN A METAL BODY AND A SEMICONDUCTOR DEVICE

[75] Inventors: Sebastian William Kessler, Jr.; Robert Franklin Keller, both of Lancaster, Pa.

[73] Assignee: RCA Corporation, New York, N.Y.

[22] Filed: Apr. 21, 1972

[21] Appl. No.: 245,926

[52] U.S. Cl. .............. 29/473.1, 29/589, 317/234 L, 317/234 M

[51] Int. Cl. .............................................. B23k 31/02

[58] Field of Search .................. 29/576 J, 589, 590, 29/591, 473.1; 317/234 L, 234 M, 234 B

[56] References Cited

UNITED STATES PATENTS

| | | | |
|---|---|---|---|
| 3,128,545 | 4/1964 | Cooper | 29/590 UX |
| 3,200,310 | 8/1965 | Carman | 317/234 M |
| 3,231,421 | 1/1966 | Schmidt | 317/234 M |
| 3,551,997 | 1/1971 | Etter | 317/234 L UX |
| 3,599,321 | 8/1971 | Schmidlin | 29/589 X |
| 3,632,436 | 1/1972 | Denning | 317/234 M X |
| 3,686,748 | 8/1972 | Engeler et al. | 29/589 X |

FOREIGN PATENTS OR APPLICATIONS

| | | | |
|---|---|---|---|
| 1,283,970 | 11/1968 | Germany | 317/234 M |

*Primary Examiner*—Robert D. Baldwin
*Assistant Examiner*—Ronald J. Shore
*Attorney*—Glenn H. Bruestle et al.

[57] ABSTRACT

A metal body is sealed to a semiconductor device by producing an insulator layer on a surface of the device, producing a semiconductor layer on the insulator layer, and bonding a surface of the body to the semiconductor layer. Preferably, an oxide layer is grown on the device surface, and a silicon layer is deposited on the oxide layer.

2 Claims, 2 Drawing Figures

METHOD OF MAKING AN ELECTRICALLY-INSULATING SEAL BETWEEN A METAL BODY AND A SEMICONDUCTOR DEVICE

The invention herein described was made in the course of or under a contract with the U. S. Department of the Army.

BACKGROUND OF THE INVENTION

This invention relates to a novel method of making a metal-to-semiconductor seal, and particularly to a method of making an electrically insulating seal between a metal body and a semiconductor device.

Various methods of making an electrically-conducting seal between a metal body and a semiconductor device are known in the prior art. See, for example, U. S. Pat. No. 3,461,357, issued on Aug. 12, 1969, to W. E. Mutter et al. However, there is a need for making an electrically insulating seal between a metal body and a semiconductor device. The transcalent semiconductor device disclosed in copending U. S. Pat. application Ser. No. 222,244, filed on Jan. 3, 1972, by S. W. Kessler, Jr., and assigned to the assignee of this application, requires such a seal to be made, for example, between a copper heat-pipe wall and a silicon device chip. For this application, the seal must also be vacuum-tight as well as mechanically strong.

SUMMARY OF THE INVENTION

The novel method of making an electrically insulating seal between a metal body and a semiconductor device comprises producing a layer of insulator material on a surface of the device, producing a layer of semiconductor material on the insulator layer, and bonding a surface of the body to the semiconductor layer. Preferably, where the device is made of silicon, the insulator layer is produced by growing an oxide on the silicon surface, and the semi-conductor layer is produced by depositing silicon on the oxide layer. Also preferably, the surface of the body is bonded to the silicon layer by evaporating a layer of palladium on the silicon layer, depositing a layer of tungsten on the palladium layer, plating a layer of nickel on the tungsten layer, and soldering the surface of the body to the nickel layer.

By producing an insulator layer on the surface of the device, the area covered thereby is electrically insulated from the remaining portions of the seal. The remaining portions can then include a layer of metal in electrical contact with the surface of the body. By producing a semiconductor layer on the insulator layer, the adherence of such a metal layer to the insulator layer is facilitated. A denser insulator layer is produced by growing an oxide, as opposed to depositing an insulator, on the device surface. If the semiconductor layer is made of silicon, then any one of several known methods of depositing a silicon layer on an oxide layer may be employed. Evaporating a layer of palladium on the silicon layer promotes the adherence of a tungsten layer thereto. The tungsten layer is evaporated on the palladium layer to give needed strength to the seal and to match the thermal expansion of the silicon portions thereof. The tungsten layer is then made solderable by plating a layer of nickel thereon.

The novel method has been successfully employed in the manufacture of transcalent thyristors, to make strong, vacuum-tight, electrically insulating seals between copper heat-pipe walls and silicon device chips.

DESCRIPTION OF THE PREFERRED EMBODIMENT

Figure 1:
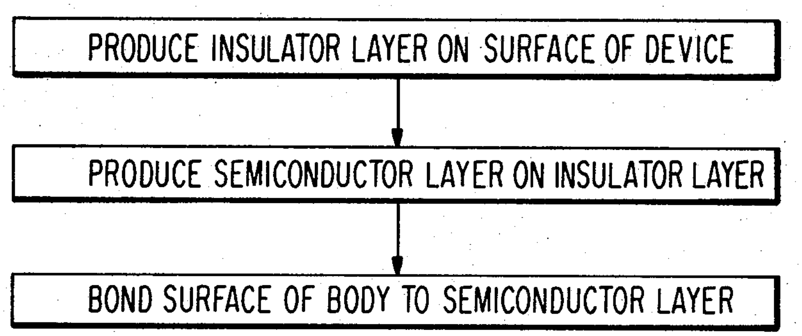
FIG. 1 is a flow chart showing the steps of the novel method.
Figure 2:
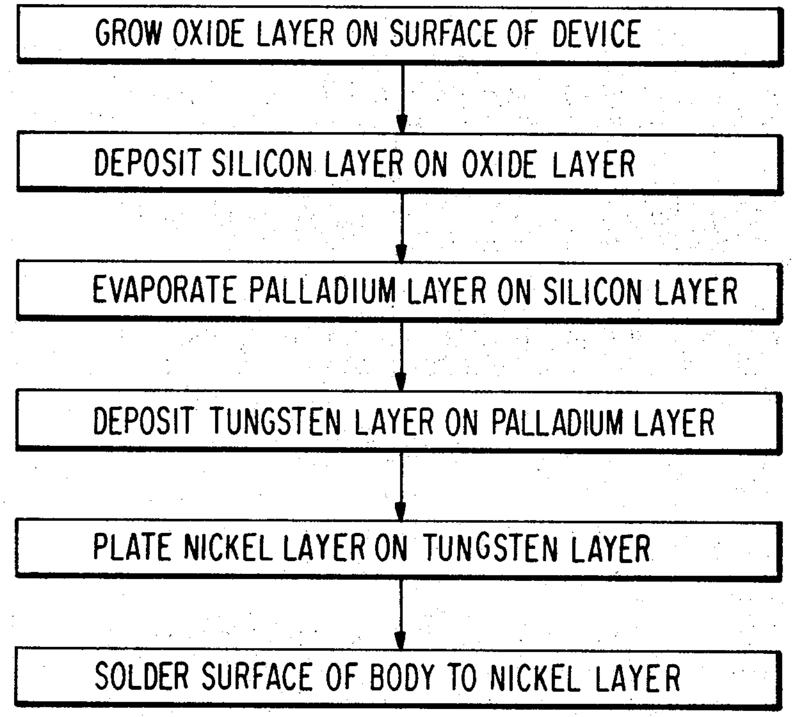
FIG. 2 is a flow chart showing the steps of the preferred embodiment of the novel method of FIG. 1.

The steps of the novel method of making an electrically insulating seal between a metal body and a semiconductor device are shown in FIG. 1. The following is an example of the novel method, the detailed steps of which are shown in FIG. 2.

A semiconductor device, such as a silicon-controlled-rectifier (SCR) chip, is sealed to a metal body, such as a heat-pipe wall made of nickel-plated copper, first by thermally growing a layer of silicon dioxide on a surface of the chip. This oxide layer is typically grown to a thickness of about 0.6 micron, in a 900°C steam atmosphere. Next, a layer of poly-crystalline silicon is deposited on the oxide layer, by the dissociation of silane at 700°C. The thickness of the silicon layer is about 1.0 micron.

A thin, e.g., about 0.1-micron, layer of palladium is then evaporated on the silicon layer. In turn, a layer of tungsten is chemically vapor-deposited on the palladium layer, typically to a thickness of about 1.0 to 1.5 microns. Next, a layer of nickel is produced on the tungsten layer, by electrolytically plating the nickel to a thickness of about 1.0 micron. Finally, the heat-pipe wall is soldered to the nickel layer, typically after the whole chip (including the nickel layer) is dipped in solder.

The seal made as above is electrically insulating to voltages as high as 50 volts, mechanically strong, and also vacuum-tight.

GENERAL CONSIDERATIONS

It should be understood that the invention is not limited to the embodiment described above. For example, as disclosed in copending U. S. Pat. application Ser. No. 222,244, cited previously, known masking as well as photo-and chemical-etching techniques may be employed to produce various seal geometries. The insulator layer may be produced on the surface of the semiconductor device other than by thermally growing a silicon dioxide layer thereon. The semiconductor layer may be deposited on the insulator layer by employing any one of several known methods for growing an epitaxial layer of silicon. A platinum, instead of palladium, layer may serve to promote the adherence of the tungsten layer to the silicon layer. This transitional layer is believed to prevent the formation of weakening fluorides of silicon, which would otherwise result from the introduction of tungsten tetrafluoride in the typical tungsten-layer depositing step. Other methods of producing the tungsten layer may eliminate any preference for such a transitional layer. Also, the surface of the body, which may be made of a metal other than nickel-plated copper, may be bonded to the semiconductor layer by other than the means of a tungsten-nickel-layer combination.

What is claimed is:

1. A method of making an electrically insulating seal between a metal body and a silicon semiconductor device, comprising the steps of:

a. producing a layer of insulator material on a surface of the device;
b. producing a layer of silicon on the insulator layer;
c. producing a transition layer on the silicon layer, the transition layer being made of a material selected from the group consisting of palladium and platinum;
d. producing a layer of tungsten on the transition layer; and
e. bonding a surface of the body to the tungsten layer.

2. A method of making an electrically insulating seal between a solderable-metal body and a silicon semiconductor device, comprising the steps of:

a. producing an oxide layer on a surface of the device;
b. producing a silicon layer on the oxide layer;
c. producing a transition layer on the silicon layer, the transition layer being made of a material selected from the group consisting of palladium and platinum;
d. producing a layer of tungsten on the transition layer;
e. producing a layer of nickel on the tungsten layer; and
f. soldering a surface of the body to the nickel layer.

* * * * *